US009991196B2

(12) United States Patent
Huang et al.

(10) Patent No.: US 9,991,196 B2
(45) Date of Patent: Jun. 5, 2018

(54) PRINTED CIRCUIT BOARD AND METHOD OF FABRICATING AN ELEMENT

(71) Applicant: Silicon Motion, Inc., Jhubei, Hsinchu County (TW)

(72) Inventors: Shu-Ying Huang, Hsinchu (TW); Te-Wei Chen, Zhubei (TW); Hsiu-Yuan Chen, Zhubei (TW)

(73) Assignee: SILICON MOTION, INC., Jhubei, Hsinchu County (TW)

( * ) Notice: Subject to any disclaimer, the term of this patent is extended or adjusted under 35 U.S.C. 154(b) by 0 days. days.

(21) Appl. No.: 15/435,398

(22) Filed: Feb. 17, 2017

(65) Prior Publication Data
US 2017/0271253 A1 Sep. 21, 2017

(30) Foreign Application Priority Data
Mar. 18, 2016 (TW) .............................. 105108416 A

(51) Int. Cl.
*H01L 21/00* (2006.01)
*H01L 23/00* (2006.01)
(Continued)

(52) U.S. Cl.
CPC .... *H01L 23/49838* (2013.01); *H01L 21/4846* (2013.01); *H01L 21/561* (2013.01);
(Continued)

(58) Field of Classification Search
CPC . H01L 21/4846; H01L 21/561; H01L 21/565; H01L 21/78; H01L 21/823807; H01L 21/823864; H01L 21/84; H01L 21/28562; H01L 23/49838; H01L 23/3114; H01L 23/49805; H01L 24/97; H01L 24/17; H01L 24/27; H05K 2201/09681; H05K 2203/072; H05K 2203/0723; H05K 3/242; H05K 3/0097; H05K 3/4602; H05K 3/4641; H05K 3/3436
See application file for complete search history.

(56) References Cited

U.S. PATENT DOCUMENTS 7,161,175 B2 * 1/2007 Shau .................. G01R 31/2856
257/48
7,186,645 B2 * 3/2007 Wood .................. H01L 21/4846
257/E21.295
(Continued)

FOREIGN PATENT DOCUMENTS

TW 200741995 A 11/2007
TW 200849541 A 12/2008

*Primary Examiner* — Nikolay Yushin
(74) *Attorney, Agent, or Firm* — McClure, Qualey & Rodack, LLP

(57) ABSTRACT

The present invention provides a printed circuit board fabricated by a Non-Plating Process that includes at least one plating bar disposed around at least one package unit of the printed circuit board. The package unit includes at least one ground line, at least one power line and a plurality of signal lines. The ground line has a first contact pad exposed on a surface of the printed circuit board, and at least one of the ground lines is connected to the plating bar. The power line has a second contact pad exposed on the surface, and at least one of the power lines is connected to the neighboring plating bar. The signal line has a third contact pad exposed on the surface.

10 Claims, 6 Drawing Sheets

(51) Int. Cl.
*H01L 23/498* (2006.01)
*H01L 21/48* (2006.01)
*H01L 21/56* (2006.01)
*H01L 21/78* (2006.01)
*H01L 23/31* (2006.01)
*H05K 3/00* (2006.01)
*H05K 3/24* (2006.01)

(52) U.S. Cl.
CPC ............ *H01L 21/565* (2013.01); *H01L 21/78* (2013.01); *H01L 23/3114* (2013.01); *H01L 23/49805* (2013.01); *H01L 24/97* (2013.01); *H05K 3/0097* (2013.01); *H05K 3/242* (2013.01); *H05K 2201/09681* (2013.01); *H05K 2203/072* (2013.01); *H05K 2203/0723* (2013.01)

(56) References Cited

U.S. PATENT DOCUMENTS

| | | | |
|---|---|---|---|
| 2005/0112880 A1* | 5/2005 | Wood | H01L 21/4846 438/689 |
| 2007/0243666 A1 | 10/2007 | Huang et al. | |
| 2008/0305579 A1 | 12/2008 | Lin et al. | |

\* cited by examiner

PRINTED CIRCUIT BOARD AND METHOD OF FABRICATING AN ELEMENT

CROSS REFERENCE TO RELATED APPLICATIONS

This Application claims priority of Taiwan Patent Application No. 105108416, filed on Mar. 18, 2016, the entirety of which is incorporated by reference herein.

BACKGROUND OF THE INVENTION

Field of the Invention

The present invention is related to a printed circuit board, and in particular to a printed circuit board manufactured by a non-plating process.

Description of the Related Art

The integrated circuit industry mainly comprises IC (Integrated Circuit) design, IC manufacturing, and chip test, wherein the current chip packaging technologies include Ball Grid Array (BGA), Chip-Size Package (CSP), Wafer Level Package (WLP), Three Dimension Package (3D package) and System in a Package (SIP). It is important for the stability of the IC that the chip structure directly affects the electric ability, mechanical ability, thermal ability, and the light sensitivity of the IC. Therefore, the chip structure has already become a core technique in the electronics industry.

At present, a chip mainly uses a printed circuit board as a substrate, and the chip would be disposed on the substrate, and the conducting pin of the chip is connected outward via the substrate. Multi Stacked-Die Packaging is arranged to integrate a plurality of dies into a single package to integrate multiple functions, save board space, reduce the space for dies, and lower the manufacturing cost. It should be noted that, generally, Multi Stacked-Die Packaging needs more than thousands of times of wiring the printed circuit board and dies. Therefore, the elements and chips of the printed circuit board fabricated by a non-plating process can easily become damaged during the wiring process of the Multi Stacked-Die Packaging due to electrostatic discharge (ESD).

BRIEF SUMMARY OF THE INVENTION

A detailed description is given in the following embodiments with reference to the accompanying drawings.

An exemplary embodiment provides a printed circuit board, and the printed circuit board is divided into at least one package unit. The printed circuit board includes at least one plating bar. The plating bar is disposed around the package unit, wherein the printed circuit board is fabricated by a Non-Plating Process. Each of the package units includes at least one ground line, at least one power line and a plurality of signal lines. The ground line has a first contact pad exposed on a surface of the printed circuit board, and at least one of the ground lines is connected to the plating bar. The power line has a second contact pad exposed on the surface of the printed circuit board, and at least one of the power lines is connected to the neighboring plating bar. Each of the signal lines has a third contact pad exposed on the surface of the printed circuit board.

Another exemplary embodiment provides a printed circuit board having a plurality of edges. The printed circuit board includes at least one ground line, at least one power line, and a plurality of signal lines. The ground line has a first contact pad exposed on a first surface of the printed circuit board. The power line has a second contact pad exposed on the first surface of the printed circuit board. Each of the signal lines has a third contact pad exposed on the first surface of the printed circuit board, wherein the printed circuit board is fabricated by a Non-Plating process, the terminal of at least one of the ground lines is extended to reach the first of the edges and is exposed on a second surface which is on the first edge and vertical to the first surface, and a terminal of at least one of the power lines is extended to a second edge and is exposed on a third surface which is on the second edge and vertical to the first surface.

Yet another exemplary embodiment provides a method of fabricating an element. The method includes: applying a non-plating process to fabricate a printed circuit board, wherein the printed circuit board is divided into a plurality of package units. The non-plating process fabricating the printed circuit board includes: performing a first plating through at least one ground pad to form at least one ground line and at least one power line on the surface of each of the package units of the printed circuit board; and performing a second plating to form a plurality of first signal lines on the surface of each of the package units of the printed circuit board.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
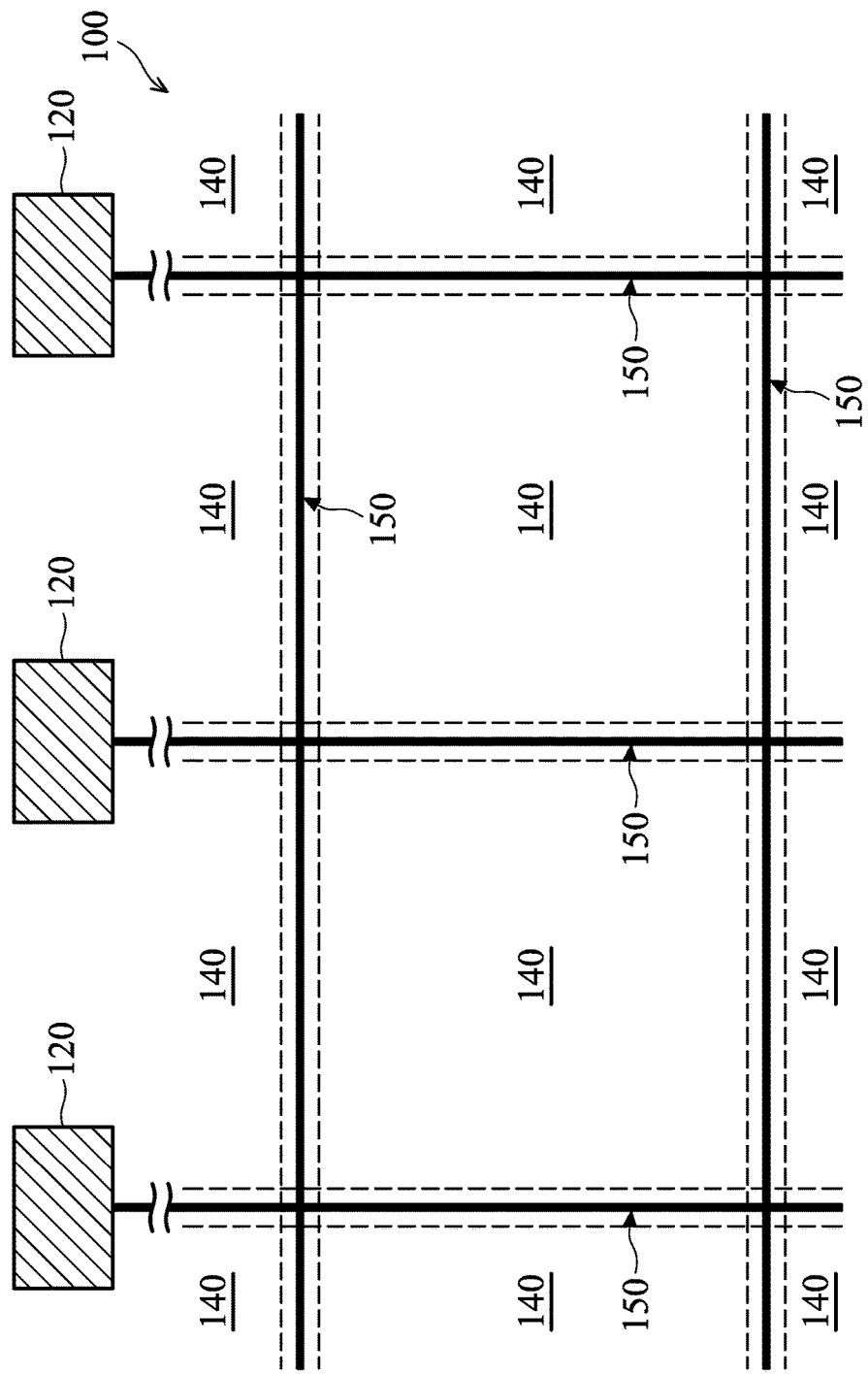
FIG. 1 is a schematic diagram illustrating a printed circuit board in accordance with an embodiment.

FIG. 1 is a schematic diagram illustrating a printed circuit board in accordance with an embodiment. The printed circuit board 100 is divided into a plurality of package units 140, wherein each of the package units 140 is arranged to carry a plurality of dies, and each of the package units 140 is arranged to be packaged into an element, such as a processor, a sensor, etc. More specifically, the printed circuit board 100 is cut along the dash lines as shown in FIG. 1 after the printed circuit board 100 is processed by the wire bonding process and the molding process of packaging, such that the printed circuit board is cut into a plurality of package units 140, wherein each of the package units 140 and the components (die) on it form an element. Each of the package units 140 includes at least on ground line, at least one power line and a plurality of signal lines, wherein each of the ground lines, power lines and signal lines has a contact pad exposing on one of the surfaces of the printed circuit board 100, such as the upper surface.

As shown in FIG. 1, the printed circuit board 100 includes at least one plating bar 150 and at least one ground pad 120, wherein the plating bar 150 is disposed around the package units 140, and the ground pads 120 are coupled with the plating bar 150. It should be noted that the printed circuit board 100 is fabricated by a Non-Plating process. Moreover, the arrangement of the plating bar 150 in FIG. 1 is one of the embodiments of the present invention. In other embodiments, the plating bar 150 can be disposed in other locations that can be easily reached by the circuit lines in the package units 140, but it is not limited thereto. Moreover, the number of package units 140 and the number of ground pads 120 can be determined by the circuit designers.

In a conventional non-plating process, the ground line is the only line that is connected to the plating bar 150 on the printed circuit board 100. Namely, all of the lines except for the ground line are not connected to the plating bar 150. Therefore, the printed circuit board 100 needs to go through plating multiple times to form all of the lines on the printed circuit board 100, and the lines which are not connected to the plating bar 150 on the printed circuit board 100 cannot release static electricity during the plating. In one of the embodiments of the present invention, the power lines of the printed circuit board 100 are also connected to the plating bar 150 as shown in FIG. 2.

Figure 2:
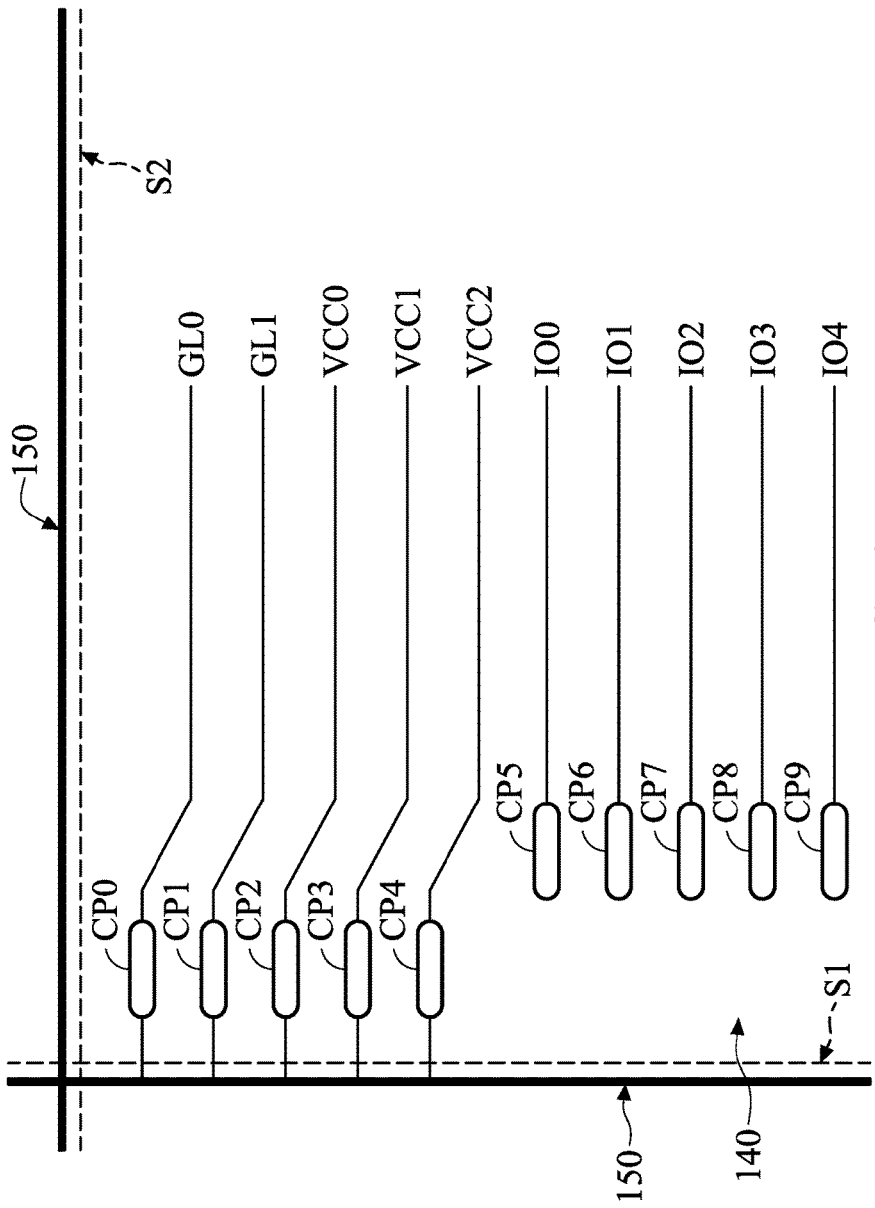
FIG. 2 is a schematic diagram illustrating a part of a package unit of printed circuit board in accordance with an embodiment.

FIG. 2 is a schematic diagram illustrating a part of a package unit of a printed circuit board in accordance with an embodiment. In this embodiment, each of the package units 140 of the printed circuit board 100 has ground lines GL0~GL1, power lines VCC0~VCC2 and signal lines IO0~IO4. It should be noted that, in this embodiment, each of the package units 140 has two ground lines, three power lines and five signal lines, wherein the number of lines are indicated to serve as an example, but it is not limited thereto. In other embodiments, the circuit designer can increase or decrease the number of lines based on the specification of the related dies, wherein the ground lines are arranged to be coupled to ground, the power lines are arranged to carry substantial voltage to provide operation voltage for the dies and other components, and the signal lines are arranged to transmit signals. The ground lines GL0~GL1 respectively have contact pads CP0~CP1 which are exposing on the surface of the printed circuit board 100, and the ground lines GL0~GL1 are connected with the neighboring plating bar 150, wherein when the printed circuit board 100 is a multilayer printed circuit board, the other parts of the ground lines GL0~GL1 except for the contact pads CP0~CP1 which are exposing on the surface of the printed circuit board 100 can be formed on the internal layers, such as the second layer, the third layer, etc. The power lines VCC0~VCC2 respectively have contact pads CP2~CP4 exposing on the surface of the printed circuit board 100, and the power line VCC0~VCC2 are connected to the neighboring plating bar 150, wherein when the printed circuit board 100 is a multilayer printed circuit board, the other parts of the power lines VCC0~VCC2 except for the contact pads CP2~CP4 exposing on the surface of the printed circuit board 100 can be formed on the internal layers, such as the second layer, the third layer, etc. The signal lines IO0~IO4 respectively have contact pads CP5~CP9 which are exposing on the surface of the printed circuit board 100 and are not connected to the plating bar 150, wherein when the printed circuit board 100 is a multilayer printed circuit board, the other parts of the signal lines IO0~IO4 except for the contact pads CP5~CP9 exposing on the surface of the printed circuit board 100 can be formed on the other internal layer of the printed circuit board 100, such as the second layer, the third layer, etc.

It should be noted that, in other embodiments, not all of the ground lines and the power lines of each of the package units 140 of the printed circuit board 100 are connected to the plating bar 150, and not all of the signal lines are decoupled from the plating bar 150. Namely, in one of the embodiments, at least one of the ground lines of each of the package units 140 needs to be connected to the neighboring plating bar 150, at least one of the power lines of each of the package units 140 needs to be connected to the plating bar 150, and at least one of the signal lines of each of the package units 140 needs to be connected to the neighboring plating bar 150.

As described above, the printed circuit board 100 is fabricated by a Non-Plating process. More specifically, the non-plating process performs plating to form the ground lines and the power lines which are coupled together by the plating bar through the ground pads 120 at once. Moreover, the non-plating process still needs to perform plating a few times to form the other lines which are not connected with the plating bar, such as the signal lines, the other ground line and/or the other power line which are not connected with the plating bar. After the printed circuit board is fabricated in the non-plating process, the printed circuit board 100 needs to be packaged, wherein the packaging process mounts at least one die on the printed circuit board 100 by a wiring process, covers and fixes the wired die on the printed circuit board 100 by a molding process, and cuts the molded printed circuit board 100 along the dash lines (positioning lines) as shown in FIG. 1 and FIG. 2 to form individual elements by a cutting process. As shown in FIG. 2, the cut printed circuit board 100 has edges S1 and S2. More specifically, as shown in FIG. 1, the element is quadrilateral, such that each piece of the printed circuit board 100 after cut along the dash lines has four edges, but it is not limited thereto. In other embodiments, when the package unit 140 is a pentagon, each piece of the printed circuit board 100 after cutting along the dash lines has five edges, and so on.

Figure 3A:
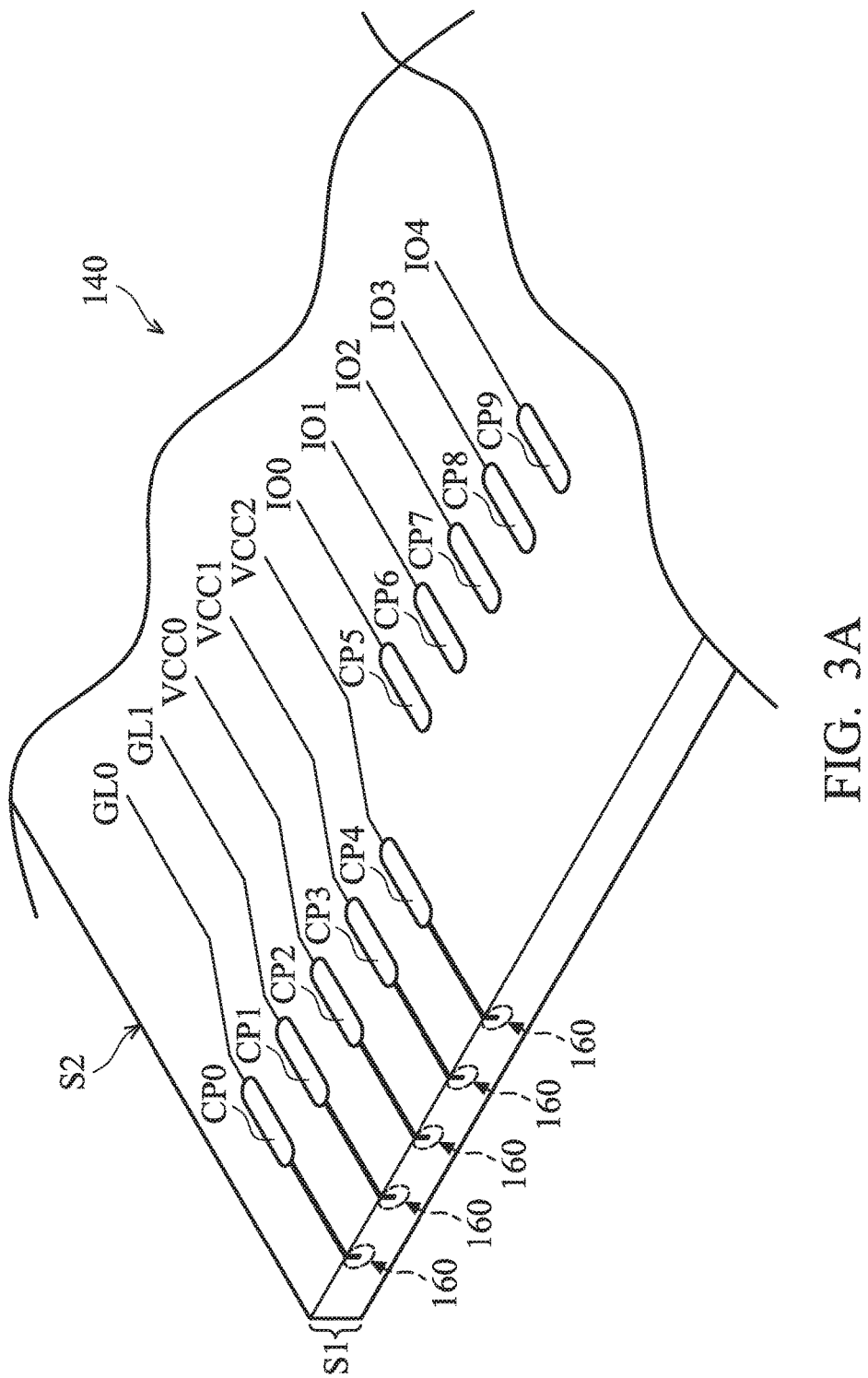
FIG. 3A is a schematic diagram illustrating a part of a package unit of printed circuit board after cutting in accordance with an embodiment.
Figure 3B:
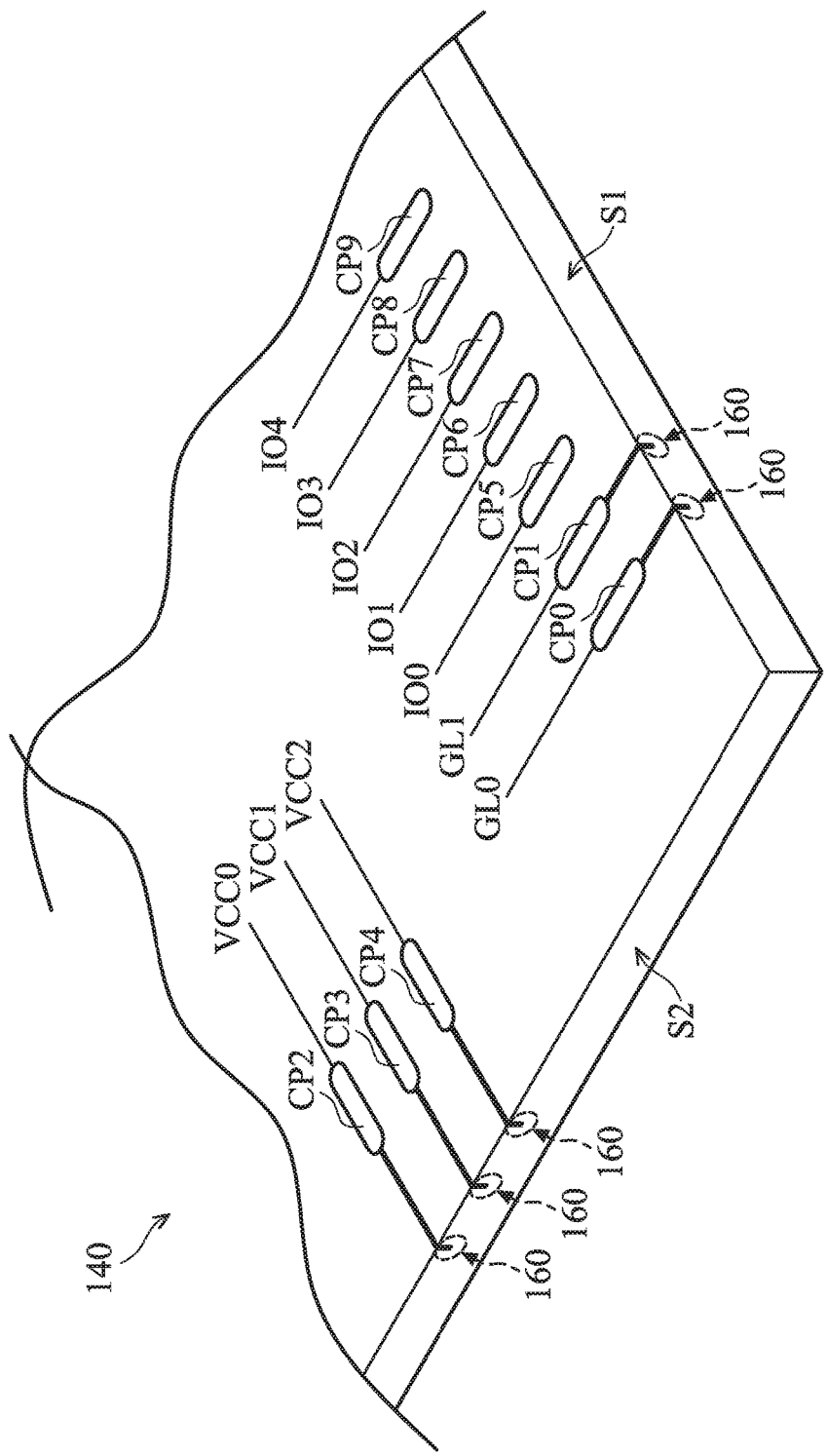
FIG. 3B is a schematic diagram illustrating a part of a package unit of printed circuit board after cutting in accordance with an embodiment.

FIG. 3A is a schematic diagram illustrating a part of a package unit of printed circuit board after cutting in accordance with an embodiment. As shown in FIG. 3A each piece of the printed circuit board 100 after cutting along the dash lines of FIG. 2, as shown in FIG. 3A, has an edge S1 and an edge S2. It should be noted that the lines connected to the plating bar 150 of the printed circuit board 100 will be decoupled from the plating bar 150 after the printed circuit board 100 is cut, so that the line connection will be consistent with the original circuit design. Namely, the ground lines GL0~GL1 and the power lines VCC0~VCC2 which are coupled with each other through the plating bar 150 will be decoupled from each other after the printed circuit board 100 is cut. As shown in FIG. 3A, the terminals of the ground lines GL0~GL1 which are separated from the plating bar 150 by the cutting process will be extended to the edge S1 and exposed on the cut surface which is on the edge S1 and vertical to the surface, and the terminals of the power lines VCC0~VCC2 which are separated from the plating bar 150 by the cutting process will be extended to the edge S1 and exposed on the cut surface which is on the edge S1 and vertical to the surface, as shown in portions 160 in FIG. 3A. Namely, the lines connected to the plating bar 150 before the cutting process will be extended to the edge of the printed circuit board 100 and exposed on the surface on the edge and vertical to the top surface and the bottom surface. In some embodiment, the terminals of the power lines VCC0~VCC2 which are separated from the plating bar 150 by the cutting process will be extended to the edge S2 and exposed on the cut surface which is on the edge S2 and vertical to the surface, as shown in portions 160 in FIG. 3B.

Figure 4:
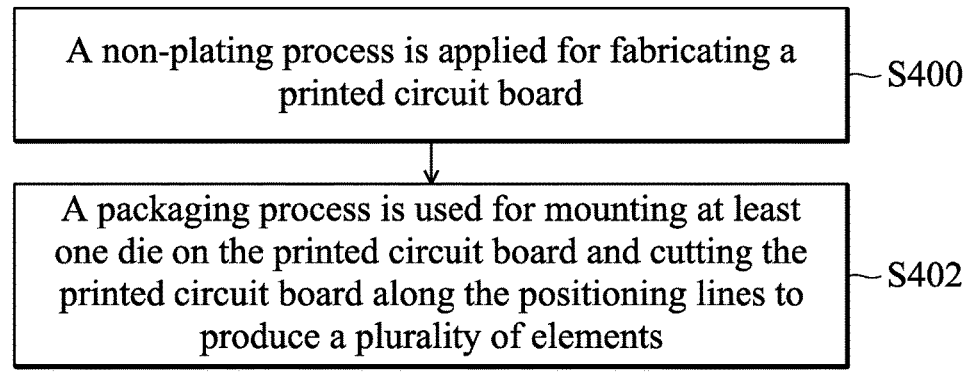
FIG. 4 is a flowchart of a method of fabricating an element in accordance with an embodiment.

FIG. 4 is a flowchart of a method for fabricating an element in accordance with an embodiment. The method of fabricating the element starts at step S400. In step S400, a non-plating process is applied for fabricating a printed circuit board 100, wherein the printed circuit board 100 is divided into a plurality of package units 140 by the positioning lines (the dash lines as shown in FIG. 1 and FIG. 2). Next, in step S402, a packaging process is used for mounting at least one die on the printed circuit board 100 and cutting the printed circuit board 100 along the positioning lines to produce a plurality of elements. The process ends at step S402.

Figure 5:
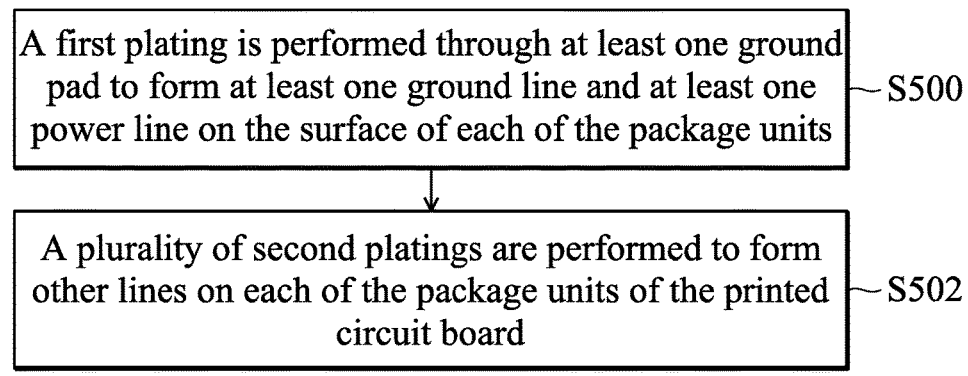
FIG. 5 is a flowchart of a non-plating process in accordance with an embodiment.

FIG. 5 is a flowchart of a non-plating process in accordance with an embodiment. The method of FIG. 4 is applied to step S400 of FIG. 4. The process starts at step S500.

In step S500, a first plating is performed through at least one ground pad 120 to form at least one ground line and at least one power line on the surface of each of the package units 140 of the printed circuit board 100, wherein the ground line and the power line formed in the first plating are coupled to each other through a plating bar 150, such that the ground line and the power line can be formed in the first plating at the same time. In one of the embodiments, all of the power lines and the ground lines of each of the package units 140 are connected to the plating bar 150 and formed in the first plating, but it is not limited thereto. In another embodiment, not all of the ground lines and the power lines of each of the package units 140 in the printed circuit board 100 are connected to the plating bar 150, and not all of the signal lines are connected to the plating bar 150. In another embodiment, each of the package units 140 has at least one signal line connected to the plating bar 150 and formed in the first plating.

Next, in step S502, a plurality of second platings are performed to form other lines on each of the package units 140 of the printed circuit board. More specifically, in step S500, the lines formed in the first plating are connected to the plating bar. In step S502, the lines which are not connected to the plating bar 150 and are not coupled to the lines connected to the plating bar 150 are formed one by one. In one of the embodiments, only signal lines are formed in the second platings. However, in other embodiments, some ground lines and power lines can be also formed by the second platings. It should be noted that the ground lines and the power lines are chosen to be connected to the plating bar, because most of the signal lines are coupled to at least one of the ground lines and the power lines. Therefore, the signal lines which are coupled to the plating bar 150 through the ground lines and the power lines can release the static electricity to ground (the ground pads 120 connected to the plating bar 150) through the ground lines and the power lines during the wiring process. Conversely, the signal lines are usually not connected to other signal lines, as it is less suitable for connecting to the plating bar 150. Furthermore, the number of signal lines is much higher than the number of power lines and ground lines, and therefore it requires more space to connect all of the signal lines to the plating bar 150 and increases noise on the elements. The process ends at step S502.

Figure 6:
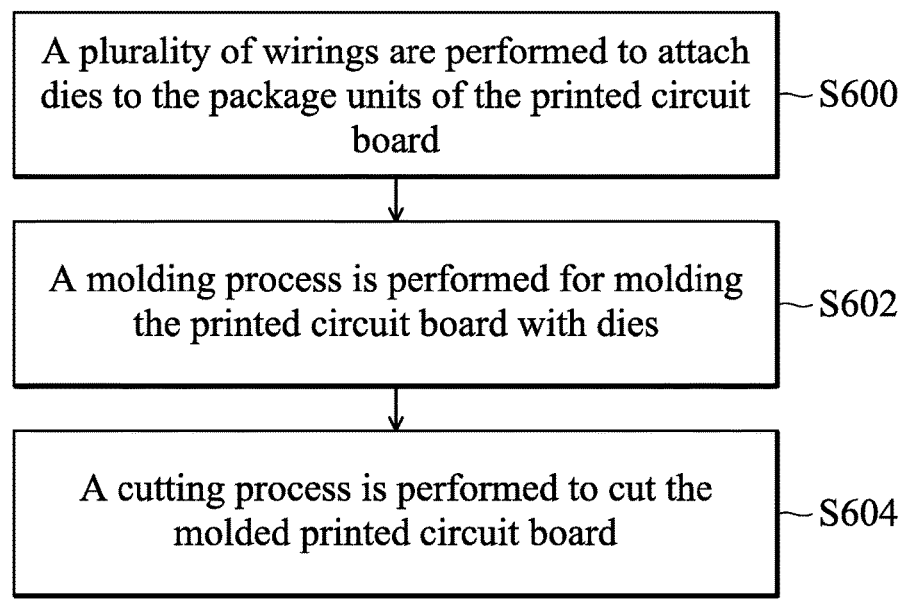
FIG. 6 is a flowchart of a non-plating process in accordance with another embodiment.

FIG. 6 is a flowchart of a non-plating process in accordance with another embodiment. The method of FIG. 6 is applied to step S402 of FIG. 4. The process starts at step S600. In step S600, a plurality of wirings are performed to bond (mount or attach) dies to the package units 140 of the printed circuit board 100. Next, in step S602, a molding process is performed for molding the printed circuit board 100 with dies. Next, in step S604, a cutting process is performed to cut the molded printed circuit board 100, wherein the printed circuit board 100 is cut according to the package units 140, and the ground lines and the power lines which are coupled to the plating bar 150 are decoupled from the plating bar 150. The process ends at step S604.

The printed circuit board and the method of fabricating an element of the present invention can decrease the electrostatic discharge on the printed circuit board fabricated by the non-plating process during the wiring process.

Data transmission methods, or certain aspects or portions thereof, may take the form of program code (i.e., executable instructions) embodied in tangible media, such as floppy diskettes, CD-ROMS, hard drives, or any other machine-readable storage medium, wherein, when the program code is loaded into and executed by a machine such as a computer, the machine thereby becomes an apparatus for practicing the methods. The methods may also be embodied in the form of program code transmitted over some transmission medium, such as electrical wiring or cabling, through fiber optics, or via any other form of transmission, wherein, when the program code is received and loaded into and executed by a machine such as a computer, the machine becomes an apparatus for practicing the disclosed methods. When implemented on a general-purpose processor, the program code combines with the processor to provide a unique apparatus that operates analogously to application-specific logic circuits.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A printed circuit board, having a plurality of edges, comprising:
   at least one ground line, wherein the ground line has a first contact pad exposed on a first surface of the printed circuit board;
   at least one power line, wherein the power line has a second contact pad exposed on the first surface of the printed circuit board; and
   a plurality of signal lines, wherein each of the signal lines has a third contact pad exposed on the first surface of the printed circuit board, wherein the printed circuit board is fabricated by a Non-Plating process, a terminal of at least one of the ground lines is extended to reach a first edge of the edges and exposed on a second surface which is on the first edge and vertical to the first surface, and a terminal of at least one of the power lines is extended to a second edge of the edges and exposed on a third surface which is on the second edge and vertical to the first surface.

2. The printed circuit board as claimed in claim 1, wherein at least one of the signal lines is not exposed on any surface which is on the edges and vertical to the first surface.

3. The printed circuit board as claimed in claim 1, wherein the signal lines are not exposed on any surface which is on the edges and vertical to the first surface.

4. The printed circuit board as claimed in claim 1, wherein the terminals of the power lines are extended to reach the second edge and exposed on the third surface which is on the second edge.

5. The printed circuit board as claimed in claim 1, wherein the terminals of all of the power lines are extended to reach the second edge of the edges and exposed on the third surface which is on the second edge.

6. A method of fabricating an element, comprising:
applying a non-plating process to fabricate a printed circuit board, wherein the printed circuit board is divided into a plurality of package units, and the non-plating process fabricating the printed circuit board comprises:
performing a first plating through at least one ground pad to form at least one ground line and at least one power line on the surface of each of the package units of the printed circuit board; and
performing a second plating to form a plurality of first signal lines on the surface of each of the package units of the printed circuit board.

7. The method as claimed in claim 6, wherein in the first plating, the at least one ground line and the at least one power line are coupled through a plating bar, so that the at least one ground line and the at least one power line are plated at the same time in the first plating.

8. The method as claimed in claim 6, wherein the first plating further comprises forming at least one second signal line.

9. The method as claimed in claim 6, wherein in the first plating, the at least one ground line, the at least one power line and the at least one second signal line are coupled through a plating bar, so that the at least one ground line, the at least one power line and the at least one second signal line are plated at the same time in the first plating.

10. The method as claimed in claim 6, further comprising a packaging process for manufacturing a plurality of elements, wherein the packaging process further comprises:
performing a plurality of wirings to respectively bond dies with the package units;
molding the printed circuit board with the dies; and
cutting the molded printed circuit board to separate the package units and separate the ground lines from the power lines.

\* \* \* \* \*